(12) United States Patent
Basol et al.

(10) Patent No.: US 11,699,622 B2
(45) Date of Patent: Jul. 11, 2023

(54) METHODS AND APPARATUS FOR TEST PATTERN FORMING AND FILM PROPERTY MEASUREMENT

(71) Applicant: Active Layer Parametrics, Inc., Scotts Valley, CA (US)

(72) Inventors: Bulent Mehmet Basol, Manhattan Beach, CA (US); Jalal Ashjaee, Cupertino, CA (US); Abhijeet Joshi, San Jose, CA (US)

(73) Assignee: Active Layer Parametrics, Inc., Scotts Valley, CA (US)

( * ) Notice: Subject to any disclaimer, the term of this patent is extended or adjusted under 35 U.S.C. 154(b) by 0 days.

(21) Appl. No.: 17/656,556

(22) Filed: Mar. 25, 2022

(65) Prior Publication Data

US 2022/0216118 A1    Jul. 7, 2022

Related U.S. Application Data

(60) Division of application No. 16/820,447, filed on Mar. 16, 2020, now Pat. No. 11,289,386, which is a
(Continued)

(51) Int. Cl.
*H01L 21/66* (2006.01)
*H01L 21/326* (2006.01)
(Continued)

(52) U.S. Cl.
CPC .......... *H01L 22/14* (2013.01); *G01R 31/2644* (2013.01); *H01L 21/02318* (2013.01); *H01L 21/326* (2013.01); *H01L 21/6715* (2013.01)

(58) Field of Classification Search
CPC . H01L 22/14; H01L 21/02318; H01L 21/326; H01L 21/6715; H01L 22/34; G01R 31/2644
(Continued)

(56) References Cited

U.S. PATENT DOCUMENTS 3,554,891 A    1/1971  Duffy et al.
3,660,250 A    5/1972  Duffy et al.
(Continued)

FOREIGN PATENT DOCUMENTS

CN    103165724 A    6/2013
EP    1237179 A1    9/2002
(Continued)

OTHER PUBLICATIONS

International Search Report received for PCT Patent Application No. PCT/US2017/029424, dated Oct. 2, 2017, 6 pages.
(Continued)

*Primary Examiner* — Giovanni Astacio-Oquendo
(74) *Attorney, Agent, or Firm* — Kubota & Basol LLP

(57) ABSTRACT

A method for electrically characterizing a layer disposed on a substrate and electrically insulated from the substrate is disclosed. The method can include forming a test pattern, contacting the test pattern with electrical contact elements at contact regions, and measuring an electrical parameter of the layer by passing a first set of test currents between contact regions. The test pattern can be formed by pushing a pattern forming head against a top surface of the layer, introducing a first fluid into the cavity, and converting the sacrificial portion of the layer into an insulator using the first fluid and forming the test pattern under the test-pattern-shaped inner seal.

8 Claims, 2 Drawing Sheets

Related U.S. Application Data continuation-in-part of application No. 16/095,930, filed as application No. PCT/US2017/029424 on Apr. 25, 2017, now Pat. No. 10,790,203.

(60) Provisional application No. 62/819,518, filed on Mar. 16, 2019, provisional application No. 62/458,500, filed on Feb. 13, 2017, provisional application No. 62/458,490, filed on Feb. 13, 2017, provisional application No. 62/494,177, filed on Jul. 30, 2016, provisional application No. 62/391,426, filed on Apr. 29, 2016, provisional application No. 62/391,331, filed on Apr. 26, 2016.

(51) Int. Cl.
  *G01R 31/26* (2020.01)
  *H01L 21/02* (2006.01)
  *H01L 21/67* (2006.01)

(58) Field of Classification Search
  USPC .................. 324/754.04, 754.03, 537, 500
  See application file for complete search history.

(56) References Cited

U.S. PATENT DOCUMENTS

| | | |
|---|---|---|
| 4,190,488 A | 2/1980 | Winters |
| 4,303,482 A | 12/1981 | Buehne et al. |
| 5,150,042 A | 9/1992 | Look et al. |
| 5,217,907 A | 6/1993 | Bulucea et al. |
| 5,652,151 A | 7/1997 | Asada |
| 6,087,189 A | 7/2000 | Huang |
| 6,136,213 A | 10/2000 | Shinozuka et al. |
| 6,290,864 B1 | 9/2001 | Patel et al. |
| 6,409,876 B1 | 6/2002 | Mcquarrie et al. |
| 6,500,356 B2 | 12/2002 | Goto et al. |
| 6,554,205 B1 | 4/2003 | Shinozuka et al. |
| 6,649,528 B2 | 11/2003 | Yanagisawa et al. |
| 6,736,987 B1 | 5/2004 | Cho |
| 6,887,337 B2 | 5/2005 | Lebouitz et al. |
| 6,908,566 B2 | 6/2005 | Yanagisawa et al. |
| 7,041,224 B2 | 5/2006 | Patel et al. |
| 7,078,919 B2 | 7/2006 | Prussin |
| 7,094,355 B2 | 8/2006 | Yanagisawa et al. |
| 8,278,222 B2 | 10/2012 | Wu et al. |
| 10,796,056 B2 * | 10/2020 | Northrop ............. G06F 30/394 |
| 2002/0142599 A1 | 10/2002 | Mcquarrie et al. |
| 2003/0016032 A1 | 1/2003 | Licini et al. |
| 2004/0063329 A1 | 4/2004 | Yanagisawa et al. |
| 2004/0203177 A1 | 10/2004 | Davis et al. |
| 2005/0052191 A1 * | 3/2005 | Prussin ............. G01R 31/2648 324/719 |
| 2005/0124085 A1 | 6/2005 | Andoh et al. |
| 2016/0079075 A1 | 3/2016 | Leseman et al. |
| 2019/0148248 A1 | 5/2019 | Basol et al. |
| 2020/0219778 A1 * | 7/2020 | Basol ..................... H01L 22/34 |

FOREIGN PATENT DOCUMENTS

| | | |
|---|---|---|
| GB | 2281402 B | 3/1997 |
| TW | 200512893 A | 4/2005 |
| TW | 201420201 A | 6/2014 |
| TW | 201535507 A | 9/2015 |

OTHER PUBLICATIONS

Non-Final Office Action received for U.S. Appl. No. 16/095,930, dated Dec. 26, 2019, 6 pages.

Notice of Allowance received for U.S. Appl. No. 16/095,930, dated Apr. 14, 2020, 6 pages.

Notice of Allowance received for U.S. Appl. No. 16/820,447, dated Dec. 16, 2021, 8 pages.

Restriction Requirement received for U.S. Appl. No. 16/820,447, dated Sep. 30, 2021, 5 pages.

Bartels et al., "A Procedure for Temperature-Dependent, Differential Van Der Pauw Measurements", Review of scientific Instruments, vol. 66, No. 8, Available online at: <https://aip.scitation.org/doi/10.1063/1.1145381>, 1995, pp. 4271-4276.

Butner et al., "The Effect of Temperature on the Etch Rate and Roughness of Surfaces Etched With XEF2", Proceedings of ASME 2010 International Mechanical Engineering Congress and Exposition. American Society of Mechanical Engineers Digital Collection, 2010, 4 pages.

Easter et al., "XeF2 Etching of Silicon For The Release of Micro-Cantilever Based Sensors", Proceedings of ASME 2008 International Mechanical Engineering Congress and Exposition. American Society of Mechanical Engineers Digital Collection, 2008, pp. 697-701.

Galloni et al., "Fully Automatic Apparatus for the Determination of Doping Profiles In Si By Electrical Measurements And Anodic Stripping", Review of scientific instruments, vol. 54, No. 3, 1983, pp. 369-373.

Kanarik et al., "Overview of Atomic Layer Etching in the Semiconductor Industry", Journal of Vacuum Science & Technology A: Vacuum, Surfaces, and Films, vol. 33, No. 2, Mar. 5, 2015, 15 pages.

Keithley, "Performing van der Pauw Sheet Resistance Measurements Using the Keithley S530 Parametric Tester", Application Note Series, No. 3180, Keithley Instruments, Inc., Aug. 1, 2012, 4 pages.

Klein et al., "Characterization of in situ Etched and Molecular Beam Epitaxy Regrown GaAs Interfaces Using Capacitance—Voltage Measurements, Far Infrared Spectroscopy, and Magnetotransport Measurements", Journal of Vacuum Science & Technology B: Microelectronics and Nanometer Structures Processing, Measurement, and Phenomena, vol. 18, No. 3, 2000, pp. 1562-1565.

Oehrlein et al., "Atomic Layer Etching at the Tipping Point: An Overview", ECS Journal of Solid State Science and Technology, vol. 4, No. 6, 2015, pp. 5041-5053.

* cited by examiner

METHODS AND APPARATUS FOR TEST PATTERN FORMING AND FILM PROPERTY MEASUREMENT

CROSS-REFERENCE TO RELATED APPLICATIONS

This application is a division of U.S. application Ser. No. 16/820,447, filed Mar. 16, 2020, which claims priority benefit of U.S. Provisional Application No. 62/819,518, filed Mar. 16, 2019, and which is a continuation-in-part application of U.S. application Ser. No. 16/095,930, filed Oct. 23, 2018 (now U.S. Pat. No. 10,790,203, issued on Sep. 29, 2020), which is a national stage application under 35 U.S.C. § 371 of International Application No. PCT/US2017/029424, filed internationally on Apr. 25, 2017, which claims priority benefit of U.S. Provisional Application No. 62/458,490, filed Feb. 13, 2017, and U.S. Provisional Application No. 62/458,500, filed Feb. 13, 2017, and U.S. Provisional Application No. 62/494,177, filed Jul. 30, 2016, and U.S. Provisional Application No. 62/391,426, filed Apr. 29, 2016, and U.S. Provisional Application No. 62/391,331, filed Apr. 26, 2016. The contents of all of the above patent applications are incorporated by reference herein in their entirety for all purposes.

GOVERNMENT RIGHTS

This invention was made with Government support under 1632322 awarded by the National Science Foundation. The Government has certain rights to this invention.

FIELD OF THE INVENTION

The present invention is in the field of thin film electrical characterization methods and apparatus. More particularly, the present invention provides methods and tools for electrical parameter measurement and depth profiling for thin layers used in semiconductor device structures.

BACKGROUND OF THE INVENTION

With the advancement of the semiconductor industry, electronic devices are getting more and more complex and they employ advanced semiconductor materials. To be able to develop and optimize such advanced devices, it is essential to measure the various electrical properties, such as mobility and carrier concentration of the layers within their structures accurately and rapidly. Some of the techniques that have been used to electrically characterize semiconductor layers include Spreading Resistance Profiling (SRP), four-point probe, Scanning Spreading Resistance Microscopy (SSRM), Secondary Ion Mass Spectrometry (SIMS), and Electrochemical Capacitance-Voltage profiling (ECV).

A wet technique for profiling an electrical parameter of a semiconductor layer was disclosed in U.S. Pat. No. 7,078,919. International application No PCT/US2017/029424 (Publication Number WO/2017/189582, titled "Methods and systems for material property profiling of thin films") describes various embodiments to controllably oxidize or thin down a test region of a semiconductor layer using a solution or an etchant gas, and to measure electrical properties as the layer at the test region is thinned down. In some of the references cited above, a sample comprising a semiconductor layer to be characterized may have the semiconductor layer in the form of a test pattern. Therefore, the test pattern may have to be formed before the sample is introduced into the electrical characterization system. Typically, the test pattern may be formed using a photolithography step followed by a plasma etching step. This approach is time consuming and requires use of different types of equipment and multiple process steps such as resist dispensing, masking, light exposure, annealing, resist developing, rinsing, drying, etching, etc. There is a need to develop a simple, low cost and fast test pattern formation process and an integrated tool with ability to accept "blanket" samples (i.e. with no test pattern) of semiconductor layers for electrical characterization.

DETAILED DESCRIPTION OF THE INVENTION

Figure 1:
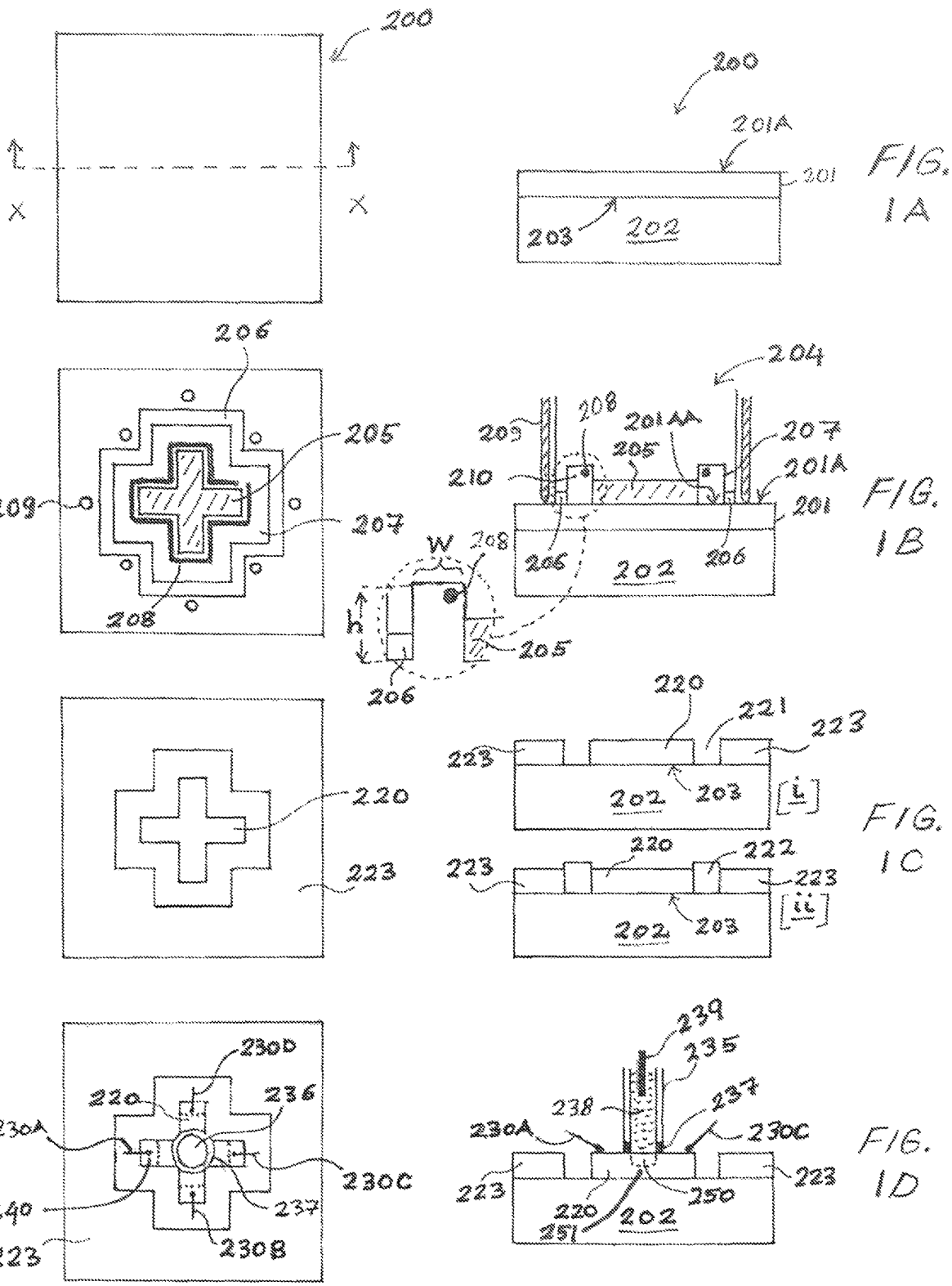
FIG. 1A is a top (left) and cross-sectional (right) view of a layer to be electrically characterized, wherein the layer has a top surface and it is disposed over a substrate.
FIG. 1B shows a pattern forming head of a test pattern generation apparatus, wherein the pattern forming head is pushed against the top surface of the layer of FIG. 1A.
FIG. 1C shows a test pattern formed by the pattern forming head of FIG. 1B, wherein the test pattern may be electrically isolated from its surroundings by a trench (see structure [i]) or an insulating plug (see structure [ii]).
FIG. 1D shows a method for electrical parameter depth profiling using a depth profiling nozzle and the test pattern formed as shown in FIG. 1C.

FIG. 1A, FIG. 1B, and FIG. 1C show a process sequence to form a test pattern comprising a section of a layer to be electrically characterized. FIG. 1D shows how an electrical parameter of the layer may be measured and depth profiled using the test pattern. Sketches on the left are top views and those on the right are cross sectional side views taken along line X-X shown in FIG. 1A.

FIG. 1A shows a stacked structure 200, comprising a layer 201 to be electrically characterized. The layer 201 may be a semiconductor layer, which may be disposed on a substrate 202. The substrate 202 may be a wafer. The layer 201 may comprise a top surface 201A. There may be an insulating interface 203, such as a rectifying junction or a thin insulator, between the layer 201 and the substrate 202. The insulating interface 203 may electrically insulate the layer 201 from the substrate 202.

In a preferred embodiment, as shown in FIG. 1B, a pattern forming head 204 of a test pattern generation apparatus may be pushed against the top surface 201A of the layer 201. The pattern forming head 204 may comprise a test-pattern-shaped inner seal 205, an outer seal 206 and a channel 207 encircling the test-pattern-shaped inner seal 205. A larger cross-sectional view of the channel 207 is shown as an inset in FIG. 1B. The channel 207 may have a width "W" and a height "h". There may also be at least one channel electrode 208 that is exposed to the channel, in other words, configured to touch any fluid that may be introduced into the channel 207. There may be one or more external contacts 209 outside the outer seal 206. Although the one or more external contacts 209 may be moved independently from the pattern forming head 204, they may preferably be attached to the pattern forming head 204 and configured to touch and establish electrical contact to the top surface 201A when the pattern forming head 204 is pushed against the top surface 201A by a first moving mechanism (not shown). Although, in the above example the pattern forming head 204 is pushed against the top surface 201A by the first moving mechanism, it is also possible that the top surface 201A is pushed against the pattern forming head 204. Therefore, the first moving mechanism may provide relative motion between the pattern forming head 204 and the layer 201. In the example of FIG. 1B, there are eight external contacts 209 surrounding the outer seal 206, and one channel electrode 208 in the form of a wire extending substantially the whole length of the channel 207. The channel electrode 208 may preferably be placed in proximity of an upper wall of the channel 207. As can be seen in the cross-sectional view of FIG. 1B, when the pattern forming head 204 is pushed against the top surface 201A of the layer 201, the test-pattern-shaped inner seal 205 and the outer seal 206 may press against the top surface 201A, forming a cavity 210. The cavity 210 is enclosed by the channel 207 and a sacrificial portion 201AA of the layer 201 that is exposed to the channel 207. The cavity 210 may be leak-free. In other words, when a gas or liquid is introduced into the cavity 210 from a fluid supply unit (not shown), the gas or liquid may contact the top surface 201A only at the sacrificial portion 201AA, which encircles the test-pattern-shaped inner seal 205, and is between the test-pattern-shaped inner seal 205 and the outer seal 206.

After forming the cavity 210, a first fluid may be introduced into the cavity 210 to convert the sacrificial portion 201AA into an insulator by either removing it and forming a trench 221, or transforming it into a very high resistivity or insulating plug 222 (see FIG. 1C). Both approaches may form an electrically isolated test pattern 220 under the test-pattern-shaped inner seal 205.

As shown in FIG. 1C, the first fluid may be used to form the test pattern 220 surrounded either by the trench 221 (structure [i]) or the insulating plug 222 (structure [ii]). It should be noted that in both structure [i] and structure [ii], the test pattern 220 may be electrically isolated from an outer portion 223 of the layer 201, such isolation being provided by the insulating interface 203 and the trench 221 (in structure [i]) or the insulating plug 222 (in structure [ii]).

In one embodiment, the first fluid may comprise an etchant in the form of a gas that may form the trench 221 and yield the structure [i] of FIG. 1C. In another embodiment the first fluid may comprise a first solution and the structure [i] may be produced in three different ways. In the first approach, the first solution may comprise a liquid etchant with the ability to etch and remove the sacrificial portion 201AA of the layer 201 when it is introduced into the cavity 210. In the second approach, the first solution may comprise an electrochemical etching liquid that may remove the sacrificial portion 201AA by electrochemical etching when it is introduced into the cavity 210 and a potential difference is applied between the one or more external contacts 209 and the channel electrode 208, preferably rendering the channel electrode 208 cathodic with respect to the one or more external contacts 209. In the third approach, the first solution may comprise an electrochemical oxidation liquid that may oxidize, but not remove the sacrificial portion 201AA when it is introduced into the cavity 210 and the potential difference is applied between the one or more external contacts 209 and the channel electrode 208. Following this oxidation step the electrochemical oxidation liquid may then be taken out of the cavity 210 and an etchant may be brought in to chemically etch away the oxidized material, thus creating the trench 221. In this third approach, if the layer 201 is thick (such as thicker than 100 nm) it is also possible to use multiple oxidation/chemical etching process sets, each process set removing only a slice of the sacrificial portion 201AA until the structure [i] shown in FIG. 1C may be obtained.

In yet another embodiment, the structure [ii] may be produced if the first solution comprises the electrochemical oxidation liquid and the potential difference is applied between the one or more external contacts 209 and the channel electrode 208 rendering the channel electrode cathodic with respect to the one or more external contacts 209. In this case, under the applied potential difference the sacrificial portion 201AA may be transformed into the insulating plug 222.

As can be seen from FIG. 1C, the test pattern 220 may be in the form of a cross, defined by the test-pattern-shaped inner seal 205 of FIG. 1B. The shape of a test pattern may be changed by selecting an inner seal with a desired shape, such as a square, a rectangle, a circle, a cloverleaf, among many other shapes. In a preferred embodiment the width "W" of the channel 207 may be smaller than 5 mm, preferably smaller than 3 mm and more preferably smaller than 2 mm. The height "h" of the channel 207 may be smaller than 8 mm, preferably smaller than 5 mm and more preferably smaller than 4 mm. A maximum lateral dimension of the test pattern 220 may be smaller than 15 m, preferably smaller than 10 m and most preferably smaller than 8 mm. The channel electrode 208 may comprise an inert material such as Pt. Although the channel 207 in the above example has a cross shape with uniform width "W", and height "h", the width as well as the height of a channel may be varied as will be seen in the example of FIG. 2, which shows a round outer seal defining a variable channel width.

Figure 2:
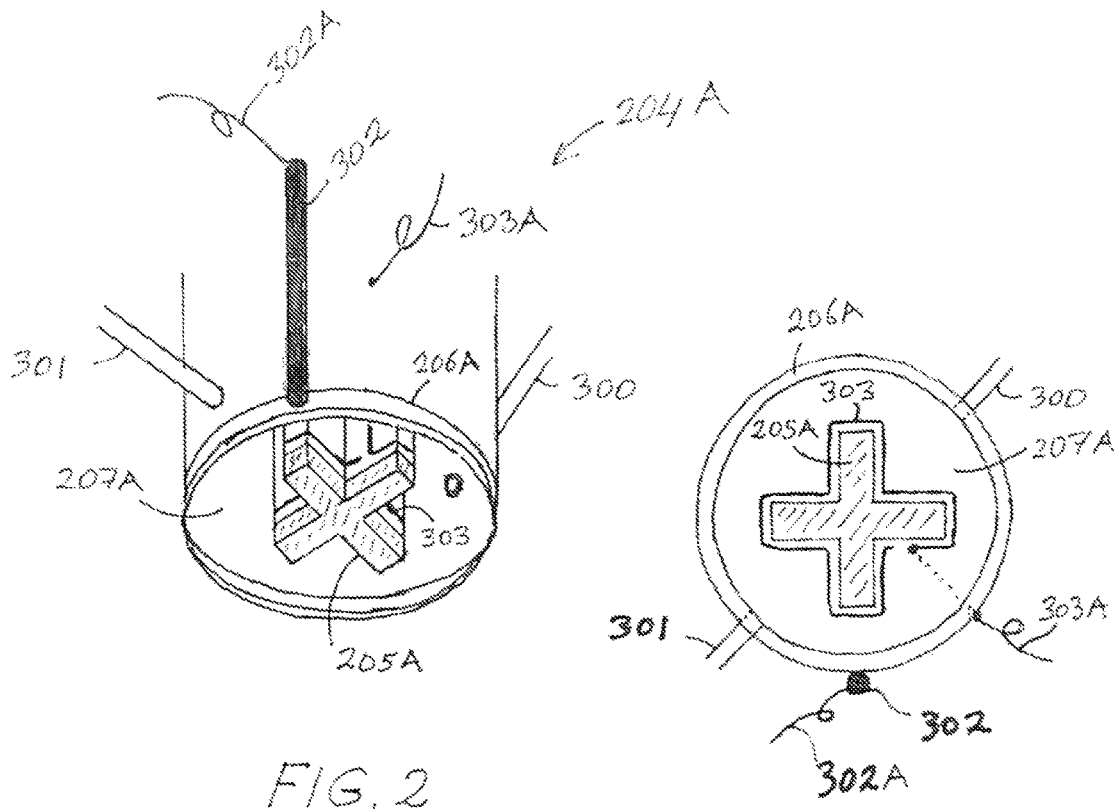
FIG. 2 shows a three-dimensional side view and a cross-sectional bottom view of an exemplary pattern forming head.

FIG. 2 shows a three-dimensional side view and a cross-sectional bottom view of an exemplary pattern forming head 204A. As depicted in this figure, the exemplary pattern forming head 204A may comprise a round outer seal 206A circling a cross-shaped inner seal 205A. There may be a fluid inlet 300 and a fluid outlet 301 connected to a fluid channel 207A between the round outer seal 206A and the cross-shaped inner seal 205A. A first electrode 302 placed outside the round outer seal 206A may be electrically connected to a first terminal 302A. A second electrode 303 may be placed in the fluid channel 207A, preferably close to the cross-shaped inner seal 205A, and it may be electrically connected to a second terminal 303A. The first electrode 302 and the second electrode 303 may serve purposes similar to the external contacts 209 and the channel electrode 208 shown in FIG. 1B. During a pattern forming process, after the exemplary pattern forming head 204A is pushed against a layer or film surface (not shown) which may also be contacted by the first electrode 302, a fluid such as an electrochemical etching liquid or electrochemical oxidation liquid may be flown to the fluid channel 207A through the fluid inlet 300 using a device such as a pump, and a potential may be applied between the first terminal 302A and the second terminal 303A to electrochemically remove or convert into an insulating plug, a portion of the film exposed to the fluid as described before in reference to FIG. 1B and FIG. 1C. Alternately, as described before an etchant gas or liquid may be delivered to the fluid channel 207A to chemically remove the portion of the film exposed to the fluid. This process may form a cross-shaped test pattern that is electrically isolated from its surroundings.

Once the test pattern 220 is formed, an electrical parameter of the layer 201 may be measured using the test pattern 220 which comprises a section of the layer 201. The electrical parameter may be one of sheet resistance, mobility, resistivity and carrier concentration. For these measurements the test pattern 220 may be contacted by at least two electrical contacts. In the example shown in FIG. 1D, four electrical contact elements 230A, 230B, 230C and 230D are applied to or pushed onto contact regions 240 of the test pattern 220 by a measurement head (not shown). The contact elements may be spring loaded contact pins. Contact regions 240 may be at predetermined locations on the test pattern 220. The electrical contact elements 230A, 230B, 230C and 230D may preferably be attached to the measurement head and configured to touch the test pattern 220 at contact regions 240 when the measurement head and the test pattern 220 are brought close to each other. An electrical parameter may then be measured by techniques that involve passing a first set of test currents between the contact regions 240. Such techniques include Van der Pauw and Hall effect measurements.

Figure 3:
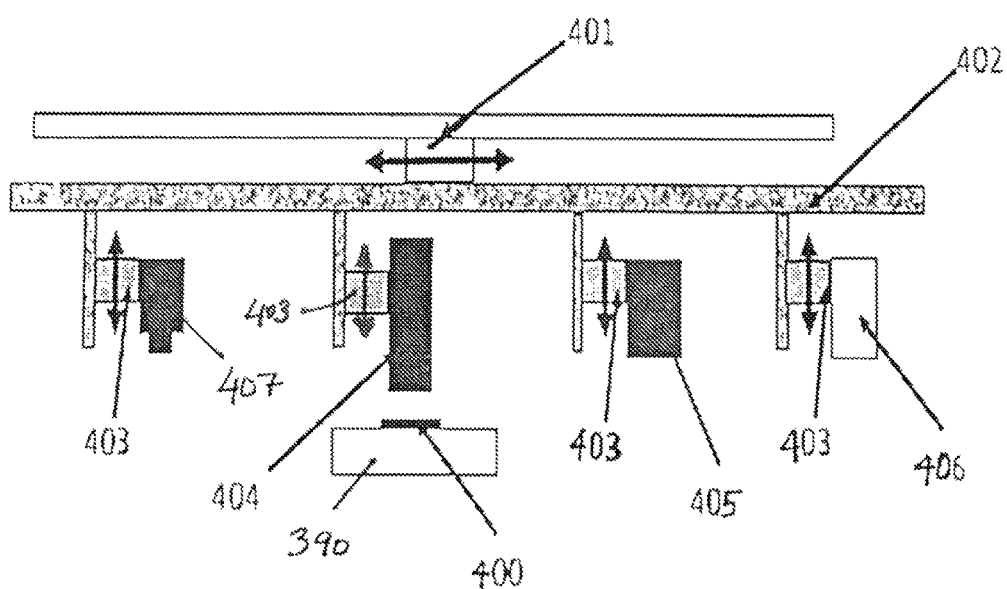
FIG. 3 shows multi-function module of an integrated tool with capability for pattern making as well as electrical characterization.

As will be further discussed in relation with FIG. 3 it is preferable to carry out the test pattern formation and electrical characterization steps sequentially in an integrated tool comprising a test pattern generation apparatus, a measurement head, and electronics for electrical characterization steps. The test pattern generation apparatus may comprise a pattern forming head, a holder to hold a substrate comprising a layer to be processed, a supply unit providing various fluids used, a computer, an optional power supply and a first moving mechanism to provide relative motion between the holder and the pattern forming head so that the pattern forming head may be pushed against a top surface of the layer to be processed. The integrated tool may further comprise a second moving mechanism to provide relative motion between the holder and the measurement head so that the test pattern formed by the test pattern generation apparatus may be contacted by electrical contact elements of the measurement head to carry out electrical measurements. The integrated tool may also comprise a third moving mechanism to provide relative motion between the holder, the pattern forming head and the measurement head. Although the holder, the pattern forming head, and the measurement head may all be moved independently, it is preferred that either the pattern forming head and the measurement head are stationary and the holder is moved, or the holder is stationary and the pattern making head and the measurement head are moved together. In other words, the pattern making head and the measurement head may be at fixed locations with respect to each other and the only relative motion between them may be the motion provided by the first moving mechanism and the second moving mechanism. This relatively small motion is in vertical direction shown by arrows in the example given in FIG. 3. In a preferred embodiment positions of the pattern making head and the measurement head may be calibrated with respect to each other. Such calibration may be achieved by attaching the two heads to a rigid structure and adjusting and fixing their relative positions and orientations so that when a test pattern, such as the test pattern 220 is formed and then the measurement head is brought close to the test pattern 220 for electrical characterization, electrical contact elements of the measurement head may touch the test pattern 220 exactly at the predetermined contact regions 240.

Referring back to FIG. 1D the test pattern 220 may also be used to depth profile the electrical parameter of the layer 201 after the electrical parameter is measured using the first set of test currents. In this case an open end of a depth profiling nozzle 235 may be sealed against the test pattern 220 such that a test region 236 on the test pattern 220 may be exposed to the open end. An elastomer seal 237 of the depth profiling nozzle 235 may seal around the test region 236 such that any fluid delivered by the depth profiling nozzle 235 may touch the test region 236. The location of the test region 236 on the test pattern 220 may be configured such that the test region 236 is outside the contact regions 240 and all of an electrical current passing between contact regions 240 may pass through the test region 236. It is preferred that electrical contact elements 230A, 230B, 230C and 230D and the depth profiling nozzle 235 are attached to the measurement head (not shown to simplify the drawing) and configured such that contacting the test pattern 220 with the electrical contact elements 230A, 230B, 230C and 230D at contact regions 240 also seals the open end of the depth profiling nozzle 235 against the test pattern 220. The depth profiling nozzle 235 may deliver an electrolyte 238 onto the test region 236. There may be a cathode 239 touching the electrolyte 238. To reduce the thickness of the layer 201 at the test region 236, a voltage may be applied between at least one of the electrical contact elements 230A, 230B, 230C and 230D, and the cathode 239 to etch, or convert into an insulating solid, a segment 250 of the layer 201 at the test region 236 of the test pattern 220, thus forming a residual layer 251. The electrical parameter of the residual layer 251 may then be measured by passing a second set of test currents between the contact regions 240. Depth profiling the electrical parameter may be continued by repeating the thickness reduction and measurement steps until no residual layer is left.

The steps of test pattern formation shown in FIG. 1A, FIG. 1B and FIG. 1C may be carried out using a test pattern generation apparatus, and the electrical characterization steps described in reference to FIG. 1D may be carried out in a separate electrical characterization module comprising the measurement head. However, as discussed before, it is preferred that these steps are carried out in an integrated tool comprising the test pattern generation apparatus, the measurement head, electronics for electrical characterization steps, and moving mechanisms. The measurement head may optionally have a depth profiling capability as described in FIG. 1D to controllably reduce the thickness of the layer to be characterized at a test region. The layer to be characterized may be stationary during the test pattern formation and electrical characterization steps, and the pattern forming head and the measurement head may be moved over the layer sequentially to carry out the various steps described above. Although the first fluid employed in pattern formation and the electrolyte employed in depth profiling the electrical parameter may comprise different chemicals, it is preferred that the first fluid and the electrolyte are the same.

In a preferred embodiment of the present inventions an integrated tool may have a configuration partially depicted in FIG. 3. Supply units providing fluids, optional power supply, electronics, etc. are not shown in this figure. In the exemplary configuration of FIG. 3, which is shown in side view, a holder 390 may hold a sample 400 comprising a layer to be electrically characterized. The sample holder 390 may be stationary. There may be a carrier arm 402 tied to a precision linear actuator 401. Components such as a microscope 404, a pattern making head 405 (which may be similar to the pattern forming head 204 of FIG. 1B or the exemplary pattern forming head 204A of FIG. 2) and a measurement head 406 may be attached to the carrier arm 402 via linear guides 403 that provide vertical motion. Mechanisms attaching these various components to the linear guides 403 may be configured with x-y translation and rotation capability so that relative positions and orientations of the components may be calibrated, adjusted and fixed. The precision linear actuator 401 may be used to move the carrier arm 402 horizontally along with the components attached to it. Linear guides 403 may move down and press the pattern making head 405 or the measurement head 406 onto the sample 400 with pre-set pressure values, when the sample 400 is under the pattern making head 405 or the measurement head 406, but otherwise retract them up to a home position. The microscope may also be moved to above the sample 400 by the linear actuator 401. The microscope 404 may be used for alignment of the sample 400 when required, and for inspection of the sample 400, for example after formation of a test pattern from the layer to be electrically characterized. The microscope 404 may preferably be a digital type with the display located outside the integrated tool for easy view by an operator. There may be one or more auxiliary head(s) 407 attached to the carrier arm 402 to perform optional auxiliary processes or tests on the sample 400. An auxiliary process may be, for example, a deposition process for conductive material deposition, such as metallic ink deposition, on contact regions on the test pattern formed. An auxiliary test may be for checking test pattern isolation to make sure the test pattern is well isolated from its surroundings. This may be a measurement of resistance between a contact region of the test pattern and a portion of the layer outside the test pattern. If the resistance is low the test pattern may be sent back to the pattern making head for further processing. As briefly discussed before, a benefit of the integrated tool described above is that the exact positions and orientations of the various heads may be carefully calibrated with respect to each other so that, for example, when a cross-shaped test pattern is formed by the pattern generating head 405 and the measurement head 406 is brought over and lowered onto the formed test pattern, electrical contact elements attached to the measurement head may touch the test pattern exactly at the contact regions located at the end of the four arms of the cross, and an optional depth profiling nozzle of the measurement head seals against the test pattern at the exact predetermined location of a test region. These factors improve the speed and accuracy of the electrical measurements.

Therefore, according to the above, some examples of the disclosure are directed to a method for electrically characterizing a layer disposed on a substrate and electrically insulated from the substrate, the said method comprising: forming a test pattern; contacting the test pattern with electrical contact elements at contact regions; and measuring an electrical parameter of the layer by passing a first set of test currents between contact regions, wherein forming the test pattern comprises: pushing a pattern forming head against a top surface of the layer, the pattern forming head comprising a test-pattern-shaped inner seal, an outer seal, and a channel between the outer seal and the test-pattern-shaped inner seal, wherein pushing the patter forming head against the top surface forms a cavity enclosed by the channel and a sacrificial portion of the layer; introducing a first fluid into the cavity, and converting the sacrificial portion of the layer into an insulator using the first fluid and forming the test pattern under the test-pattern-shaped inner seal, wherein the test pattern is electrically isolated from an outer portion of the layer that lies outside the outer seal. Additionally or alternatively to one or more of the examples above, in some examples, converting the sacrificial portion of the layer into an insulator comprises removing the sacrificial portion of the layer by the first fluid and forming a trench. Additionally or alternatively to one or more of the examples above, in some examples, removing the sacrificial portion of the layer comprises applying a potential difference between an external contact touching the top surface outside the outer seal and a channel electrode configured to touch the first fluid. Additionally or alternatively to one or more of the examples above, in some examples, the external contact is attached to the pattern forming head and configured to touch the top surface when the pattern forming head is pushed against the top surface of the layer forming the cavity. Additionally or alternatively to one or more of the examples above, in some examples, the method further comprises depth profiling the electrical parameter, said depth profiling comprising: sealing an open end of a depth profiling nozzle against the test pattern such that a test region on the test pattern is exposed to the open end; delivering an electrolyte onto the test region through the open end after measuring the electrical parameter of the layer; reducing the thickness of the layer at the test region thus forming a residual layer by applying voltage between a cathode touching the electrolyte and at least one of the electrical contact elements, and measuring the electrical parameter of the residual layer by passing a second set of test currents between contact regions, wherein the electrical contact elements and the depth profiling nozzle are attached to a measurement head, and wherein contacting the test pattern with electrical contact elements at contact regions also seals the open end of the depth profiling nozzle against the test pattern. Additionally or alternatively to one or more of the examples above, in some examples, forming the test pattern and depth profiling the electrical parameter are carried out sequentially in an integrated tool comprising the pattern forming head, the measurement head, a holder holding the substrate, and a moving mechanism providing relative motion between the holder and the two heads. Additionally or alternatively to one or more of the examples above, in some examples, the first fluid and the electrolyte are the same. Additionally or alternatively to one or more of the examples above, in some examples, converting the sacrificial portion of the layer into an insulator comprises: applying a potential difference between an external contact touching the top surface outside the outer seal and a channel electrode configured to touch the first fluid, and transforming the sacrificial portion of the layer into an insulating plug. Additionally or alternatively to one or more of the examples above, in some examples, the external contact is attached to the pattern forming head and configured to touch the top surface when the pattern forming head is pushed against the top surface forming the cavity. Additionally or alternatively to one or more of the examples above, in some examples, the method further comprises depth profiling the electrical parameter, said depth profiling comprising: sealing an open end of a depth profiling nozzle against the test pattern such that a test region on the test pattern is exposed to the open end; delivering an electrolyte onto the test region through the open end after measuring the electrical parameter of the layer; reducing the thickness of the layer at the test region thus forming a residual layer by applying voltage between a cathode touching the electrolyte and at least one of the electrical contact elements, and measuring the electrical parameter of the residual layer by passing a second set of test currents between contact regions, wherein the electrical contact elements and the depth profiling nozzle are attached to a measurement head, and wherein contacting the test pattern with electrical contact elements at contact regions also seals the open end of the depth profiling nozzle against the test pattern. Additionally or alternatively to one or more of the examples above, in some examples, applying the voltage between the cathode and at least one of the electrical contact elements converts a segment of the layer at the test region into an insulating solid. Additionally or alternatively to one or more of the examples above, in some examples, forming the test pattern and depth profiling the electrical parameter are carried out sequentially in an integrated tool comprising the pattern forming head, the measurement head, a holder holding the substrate, and a moving mechanism providing relative motion between the holder and the two heads. Additionally or alternatively to one or more of the examples above, in some examples, the first fluid and the electrolyte are the same.

Some examples of the disclosure are directed to a test pattern generation apparatus for forming a test pattern from a layer disposed on a substrate comprising: a supply unit providing a fluid; a pattern forming head comprising a test-pattern-shaped inner seal, an outer seal, and a channel between them; a holder to hold the substrate; a first moving mechanism providing relative motion between the holder and the pattern forming head so that the pattern forming head may be pushed against a top surface of the layer to form a cavity enclosed by the channel and a sacrificial portion of the layer; and a fluid inlet configured to deliver the fluid from the supply unit to the channel to convert the sacrificial portion of the layer into an insulator, forming the test pattern. Additionally or alternatively to one or more of the examples above, in some examples, the test pattern generation apparatus further comprises a channel electrode; one or more external contacts; and a power supply connected between the channel electrode and one or more external contacts, wherein the channel electrode is configured to touch the fluid delivered by the fluid inlet, and wherein one or more external contacts are attached to the pattern forming head and configured to touch the top surface of the layer outside the outer seal when the pattern forming head is pushed against the top surface forming the cavity.

Some examples of the disclosure are directed to an integrated tool for forming a test pattern from a layer disposed on a substrate and electrically characterizing the said layer, the tool comprising: a supply unit providing a fluid; a pattern forming head comprising a test-pattern-shaped inner seal, an outer seal, and a channel between them; a holder to hold the substrate; a first moving mechanism providing relative motion between the holder and the pattern forming head so that the pattern forming head may be pushed against a top surface of the layer to form a cavity enclosed by the channel and a sacrificial portion of the layer; a fluid inlet configured to deliver the fluid from the supply unit to the channel to convert the sacrificial portion of the layer into an insulator, forming the test pattern; a measurement head comprising electrical contact elements; and a second moving mechanism configured to provide relative motion between the holder and the measurement head so that the electrical contact elements can touch the test pattern at predetermined contact regions. Additionally or alternatively to one or more of the examples above, in some examples, the integrated tool further comprises: a channel electrode; one or more external contacts; and a power supply connected between the channel electrode and one or more external contacts, wherein the channel electrode is configured to touch the fluid delivered by the fluid inlet, and wherein one or more external contacts are attached to the pattern forming head and configured to touch the top surface of the layer outside the outer seal when the pattern forming head is pushed against the top surface forming the cavity. Additionally or alternatively to one or more of the examples above, in some examples, the integrated tool further comprises a source to provide an electrolyte; a depth profiling nozzle attached to the measurement head and having capacity to deliver the electrolyte to its open end, wherein the open end is configured to seal against the test pattern at a test region when the electrical contact elements touch the test pattern at predetermined contact regions; a cathode configured to touch the electrolyte; and a power source capable of applying a voltage between the cathode and at least one of the electrical contact elements. Additionally or alternatively to one or more of the examples above, in some examples, the integrated tool further comprises an auxiliary process head for depositing a conductive material on contact regions of the test pattern. Additionally or alternatively to one or more of the examples above, in some examples, the integrated tool further comprises an auxiliary test head for checking test pattern isolation by measuring a resistance between the test pattern and a portion of the layer outside the test pattern.

Although the foregoing description has shown, illustrated and described various embodiments of the present invention, it will be apparent that various substitutions, modifications and changes to the embodiments described may be made by those skilled in the art without departing from the spirit and scope of the present inventions.

We claim:

1. A test pattern generation apparatus for forming a test pattern from a layer disposed on a substrate comprising:
   a supply unit providing a fluid;
   a pattern forming head comprising a test-pattern-shaped inner seal, an outer seal, and a channel between them;
   a holder to hold the substrate;
   a first moving mechanism providing relative motion between the holder and the pattern forming head so that the pattern forming head may be pushed against a top surface of the layer to form a cavity enclosed by the channel and a sacrificial portion of the layer; and
   a fluid inlet configured to deliver the fluid from the supply unit to the channel to convert the sacrificial portion of the layer into an insulator, forming the test pattern.

2. The test pattern generation apparatus according to claim 1 further comprising:
   a channel electrode;
   one or more external contacts; and
   a power supply connected between the channel electrode and the one or more external contacts, wherein the channel electrode is configured to touch the fluid delivered by the fluid inlet, and wherein the one or more external contacts are configured to touch the top surface of the layer outside the outer seal when the pattern forming head is pushed against the top surface forming the cavity.

3. The test pattern generation apparatus according to claim 2 wherein the one or more external contacts are attached to the pattern forming head.

4. An integrated tool for forming a test pattern from a layer disposed on a substrate and electrically characterizing the said layer, the tool comprising:
   a supply unit providing a fluid;
   a pattern forming head comprising a test-pattern-shaped inner seal, an outer seal, and a channel between them;
   a holder to hold the substrate;
   a first moving mechanism providing relative motion between the holder and the pattern forming head so that the pattern forming head may be pushed against a top surface of the layer to form a cavity enclosed by the channel and a sacrificial portion of the layer;

a fluid inlet configured to deliver the fluid from the supply unit to the channel to convert the sacrificial portion of the layer into an insulator, forming the test pattern;

a measurement head comprising electrical contact elements; and a second moving mechanism configured to provide relative motion between the holder and the measurement head so that the electrical contact elements may be brought into contact with the test pattern at predetermined contact regions.

5. The integrated tool according to claim 4, further comprising:

a channel electrode;

one or more external contacts; and a power supply connected between the channel electrode and the one or more external contacts, wherein the channel electrode is configured to touch the fluid delivered by the fluid inlet, and wherein the one or more external contacts are configured to touch the top surface of the layer outside the outer seal when the pattern forming head is pushed against the top surface forming the cavity.

6. The integrated tool according to claim 5, further comprising:

a source to provide an electrolyte;

a depth profiling nozzle attached to the measurement head and having capacity to deliver the electrolyte to its open end, wherein the open end is configured to seal against the test pattern at a test region when the electrical contact elements touch the test pattern at the predetermined contact regions;

a cathode configured to touch the electrolyte; and a power source capable of applying a voltage between the cathode and at least one of the electrical contact elements.

7. The integrated tool according to claim 6, further comprising an auxiliary process head for depositing a conductive material on the predetermined contact regions of the test pattern.

8. The integrated tool according to claim 6, further comprising an auxiliary test head for checking test pattern isolation by measuring a resistance between the test pattern and a portion of the layer outside the test pattern.

* * * * *

UNITED STATES PATENT AND TRADEMARK OFFICE
CERTIFICATE OF CORRECTION

| | |
|---|---|
| PATENT NO. | : 11,699,622 B2 |
| APPLICATION NO. | : 17/656556 |
| DATED | : July 11, 2023 |
| INVENTOR(S) | : Bulent Mehmet Basol, Jalal Ashjaee and Abhijeet Joshi |

It is certified that error appears in the above-identified patent and that said Letters Patent is hereby corrected as shown below:

In the Specification
In Column 4, Line 29, delete "15 m" and insert --15 mm--.
In Column 4, Line 30, delete "10 m" and insert --10 mm--.

Signed and Sealed this
Fifth Day of September, 2023

Katherine Kelly Vidal
*Director of the United States Patent and Trademark Office*